United States Patent
Huang

(10) Patent No.: US 10,816,279 B2
(45) Date of Patent: Oct. 27, 2020

(54) HIGH-EFFICIENCY WATER-COOLED HEAT DISSIPATION DEVICE

(71) Applicant: Han Xu Hardware Plastic Technological Co., Ltd., Dongguan, Guangdong (CN)

(72) Inventor: Tsung-Hsien Huang, Dongguan (CN)

(73) Assignee: HAN XU HARDWARE PLASTIC TECHNOLOGICAL CO., LTD., Dongguan, Guangdong (CN)

( * ) Notice: Subject to any disclaimer, the term of this patent is extended or adjusted under 35 U.S.C. 154(b) by 82 days.

(21) Appl. No.: 16/177,444

(22) Filed: Nov. 1, 2018

(65) Prior Publication Data

US 2020/0141662 A1     May 7, 2020

(51) Int. Cl.
    *F28F 3/10*     (2006.01)

(52) U.S. Cl.
    CPC ............ *F28F 3/10* (2013.01); *F28F 2230/00* (2013.01); *F28F 2250/08* (2013.01)

(58) Field of Classification Search
CPC ...... F28F 2230/00; F28F 3/10; F28F 2250/08; F28F 9/0226; H05K 7/20263; H05K 7/20272
See application file for complete search history.

(56) References Cited

U.S. PATENT DOCUMENTS

| 7,753,662 | B2 * | 7/2010 | Lai | ...................... | F04D 13/0606 |
| | | | | | 165/80.4 |
| 2017/0212560 | A1 * | 7/2017 | Tsai | .......................... | G06F 1/20 |

* cited by examiner

*Primary Examiner* — Jianying C Atkisson
*Assistant Examiner* — For K Ling
(74) *Attorney, Agent, or Firm* — Leong C. Lei

(57) ABSTRACT

A high-efficiency water-cooled heat dissipation device includes a heat sink base, an inner cover, an impeller, a lower casing and a motor that are arranged from bottom to top. By providing the inner cover, the inner cover covers a fin portion of the heat sink base. When in use, a cold liquid flows into the inner cover from first perforations and is evenly distributed on the fin portion, and then flows out of a liquid outlet chamber from second perforations, so that the cold liquid can be effectively drained to avoid the mixing of the cold liquid and the hot liquid, thereby fully utilizing the cold liquid for heat absorption to improve the heat dissipation effect.

14 Claims, 9 Drawing Sheets

HIGH-EFFICIENCY WATER-COOLED HEAT DISSIPATION DEVICE

BACKGROUND OF THE INVENTION

1. Field of the Invention

The present invention relates to a heat dissipation device, and more particularly to a high-efficiency water-cooled heat dissipation device.

2. Description of the Prior Art

With the rapid development of electronic technology and information network technology, computers have become an indispensable part in our daily life. With the rapid development of electronic technology, the performance of computers has increased rapidly. The increase in performance is accompanied by an increase in the amount of heat generated by the internal parts of the computer, which has a serious impact on the performance and the service life of the computer.

At present, the heat dissipation device used for internal parts of the computer is generally a water-cooled heat dissipation device. A conventional water-cooled heat dissipation device is not perfect in structural design, which cannot effectively drain the cold liquid. When in use, the cold liquid and the hot liquid may be mixed together. The cold liquid cannot be fully utilized for heat absorption, causing a decrease in heat dissipation effect. Therefore, it is necessary to improve the conventional water-cooled heat dissipation device.

SUMMARY OF THE INVENTION

In view of the drawbacks of the prior art, the primary object of the present invention is to provide a high-efficiency water-cooled heat dissipation device, which can effectively solve the problem that the conventional water-cooled heat dissipation device cannot effectively drain the cold liquid.

In order to achieve the above object, the present invention adopts the following technical solutions.

A high-efficiency water-cooled heat dissipation device comprises a heat sink base, an inner cover, an impeller, a lower casing and a motor that are arranged from bottom to top. The lower casing has a liquid inlet and a liquid outlet. The heat sink base is sealedly fixed to a bottom of the lower casing. An airtight accommodating chamber is defined between the heat sink base and the lower casing. A first sealing ring is interposed between a periphery of a surface of the heat sink base and the lower casing. The heat sink base has a fin portion extending from the surface of the heat sink base. The inner cover is disposed on the heat sink base and covers the fin portion. The inner cover is located in the accommodating chamber and partitions the accommodating chamber into a liquid inlet chamber and a liquid outlet chamber which are sealed. The liquid inlet and the liquid outlet communicate with the liquid inlet chamber and the liquid outlet chamber, respectively. A surface of the inner cover is formed with first perforations communicating with the liquid inlet chamber and an interior of the inner cover. A bottom of a circumferential side of the inner cover is formed with second perforations communicating with the liquid outlet chamber and the interior of the inner cover. A second sealing ring is interposed between a periphery of the surface of the inner cover and the lower casing. The impeller is rotatably disposed in the liquid inlet chamber. The motor is disposed on the lower casing. An output shaft of the motor extends into the liquid inlet chamber and is coupled to the impeller.

Compared with the prior art, the present invention has obvious advantages and beneficial effects. Specifically, it can be known from the above technical solutions:

By providing the inner cover, the inner cover covers the fin portion. When in use, the cold liquid flows into the inner cover from the first perforations and is evenly distributed on the fin portion, and then flows out of the liquid outlet chamber from the second perforations, so that the cold liquid can be effectively drained to avoid the mixing of the cold liquid and the hot liquid, thereby fully utilizing the cold liquid for heat absorption to improve the heat dissipation effect greatly.

DETAILED DESCRIPTION OF THE PREFERRED EMBODIMENTS

Figure 1:
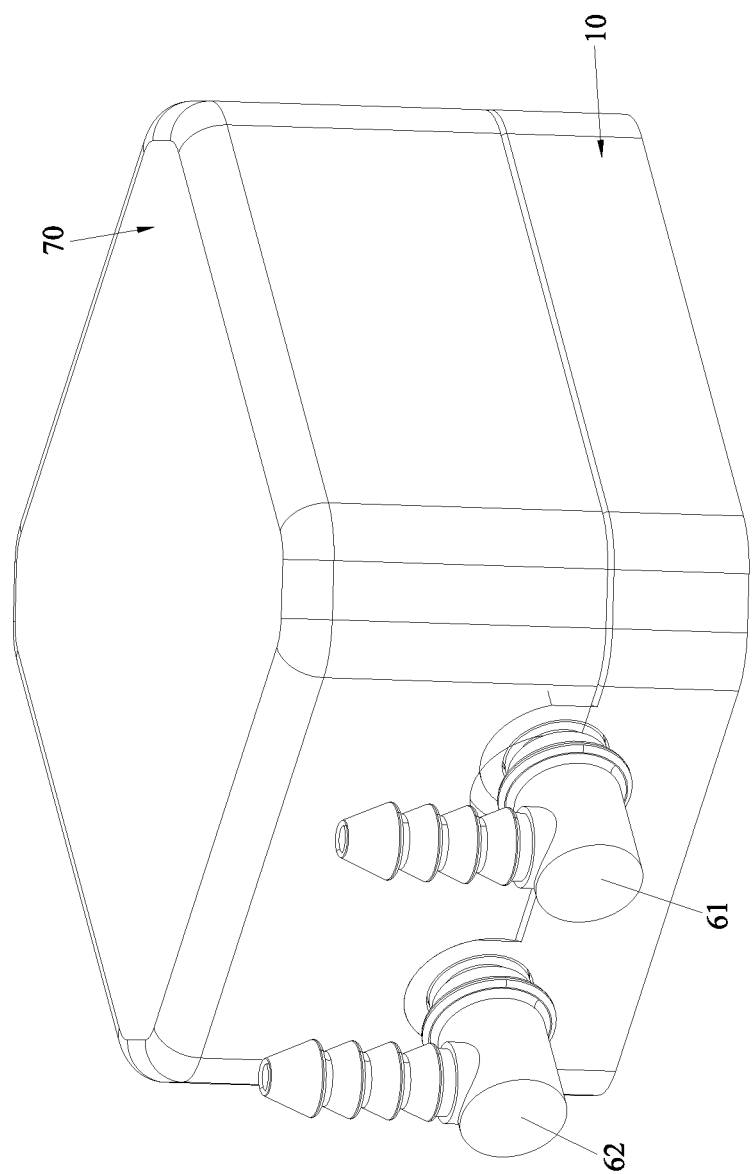
FIG. 1 is a perspective view according to a preferred embodiment of the present invention.
Figure 2:
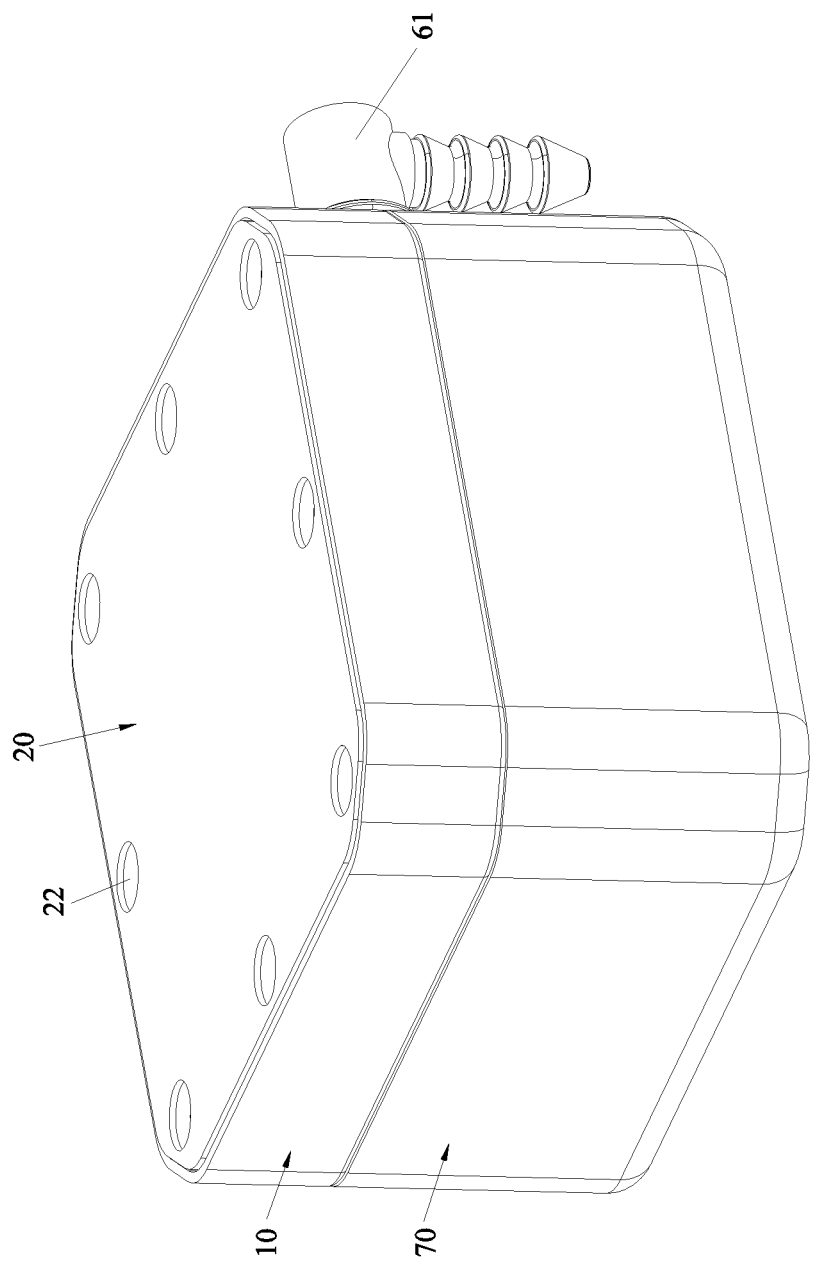
FIG. 2 is another perspective view according to the preferred embodiment of the present invention.
Figure 3:
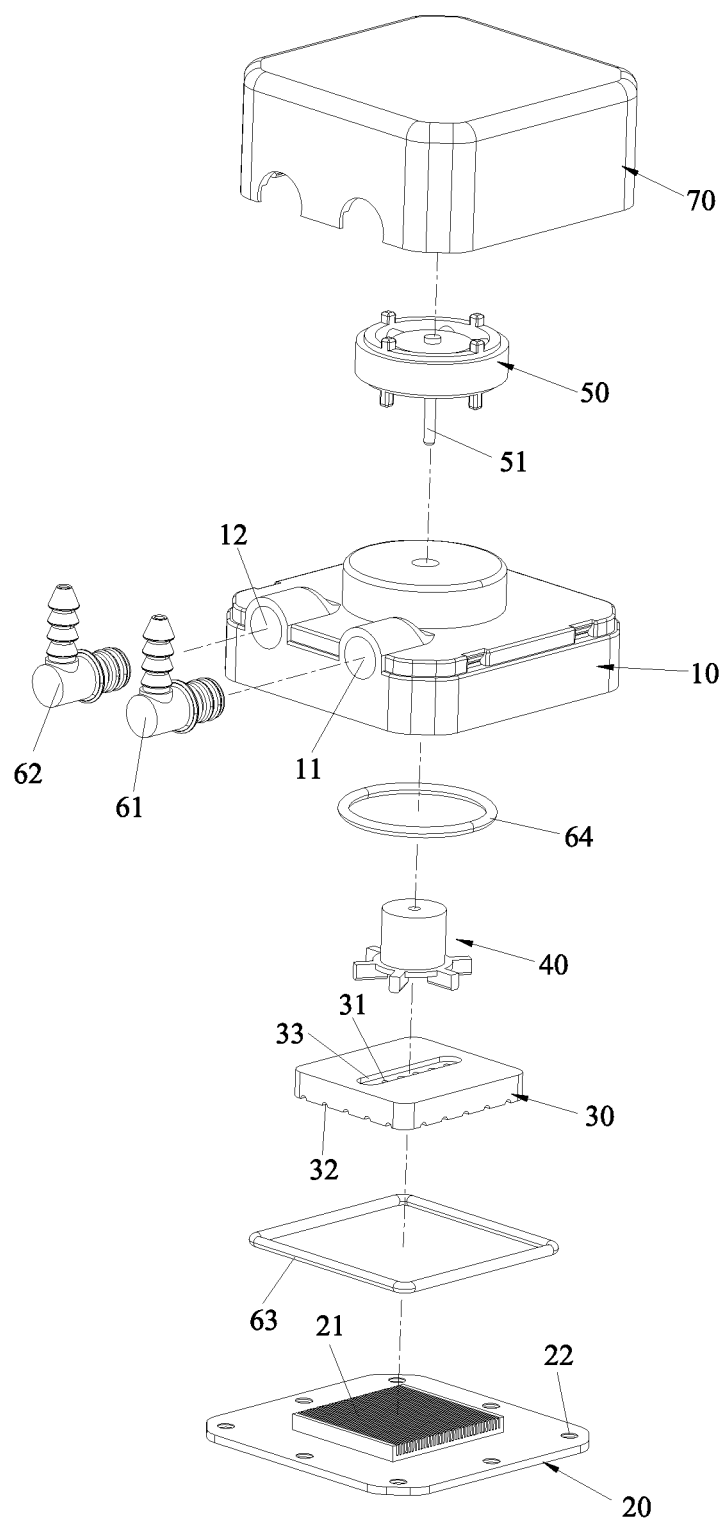
FIG. 3 is an exploded view according to the preferred embodiment of the present invention.
Figure 4:
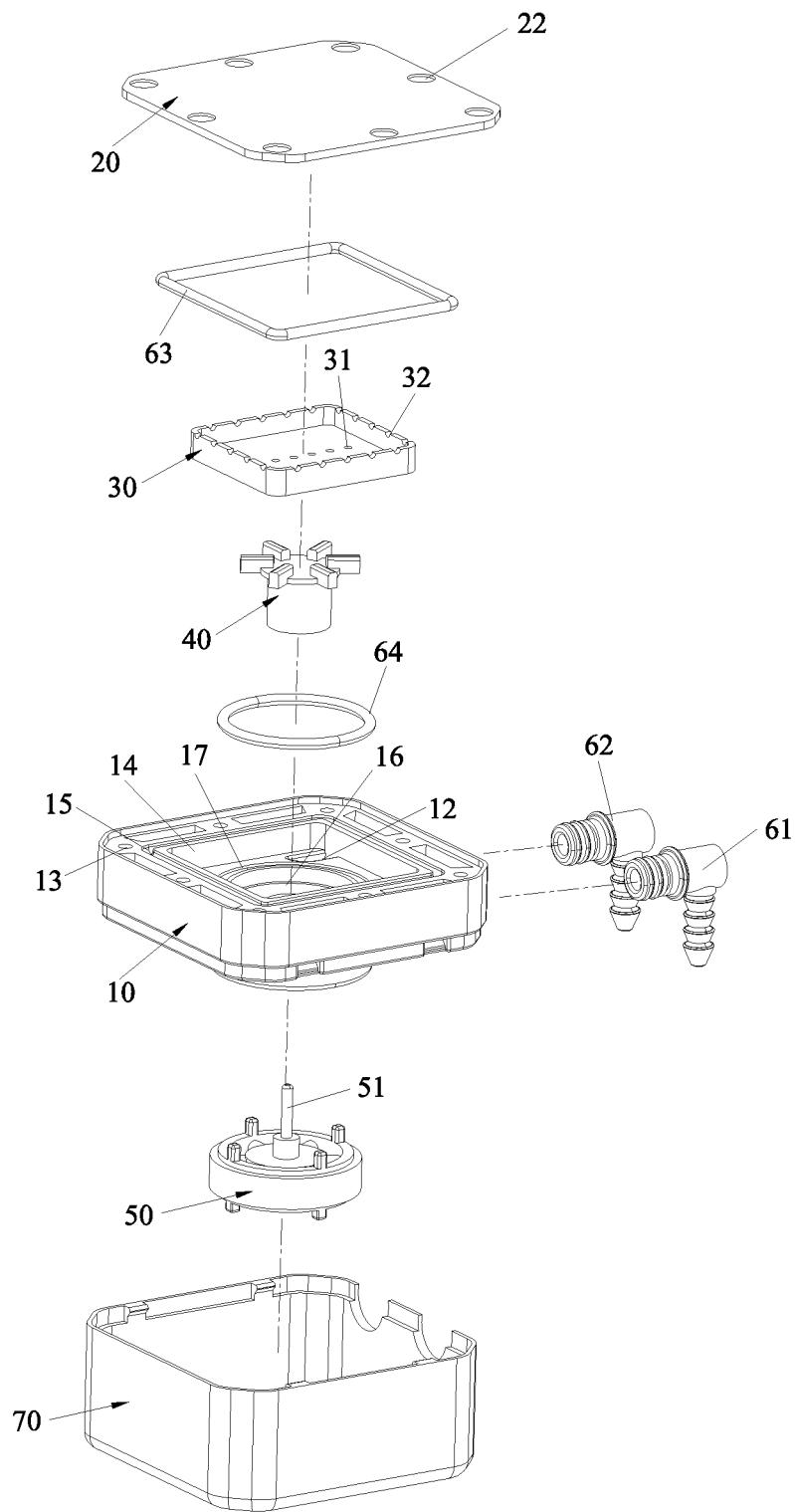
FIG. 4 is another exploded view according to the preferred embodiment of the present invention.
Figure 5:
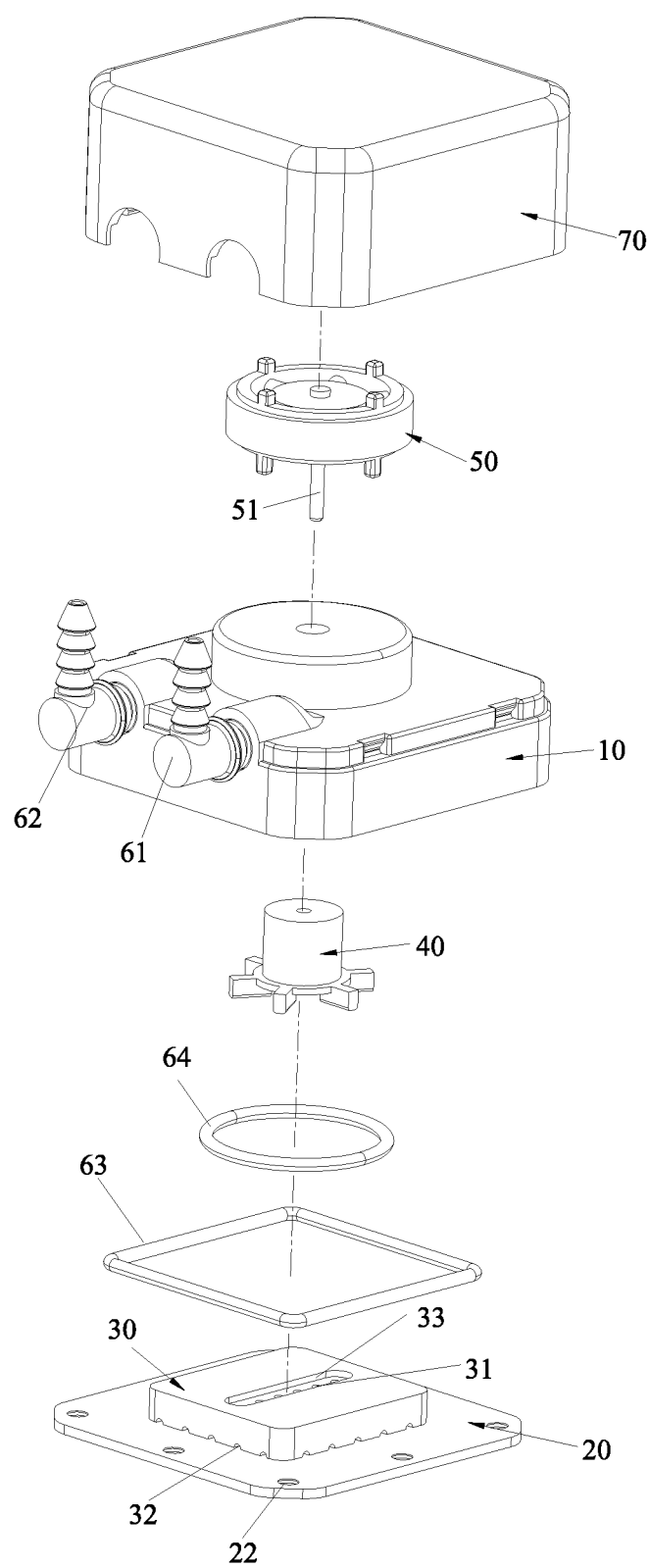
FIG. 5 is a partially assembled view according to the preferred embodiment of the present invention.
Figure 6:
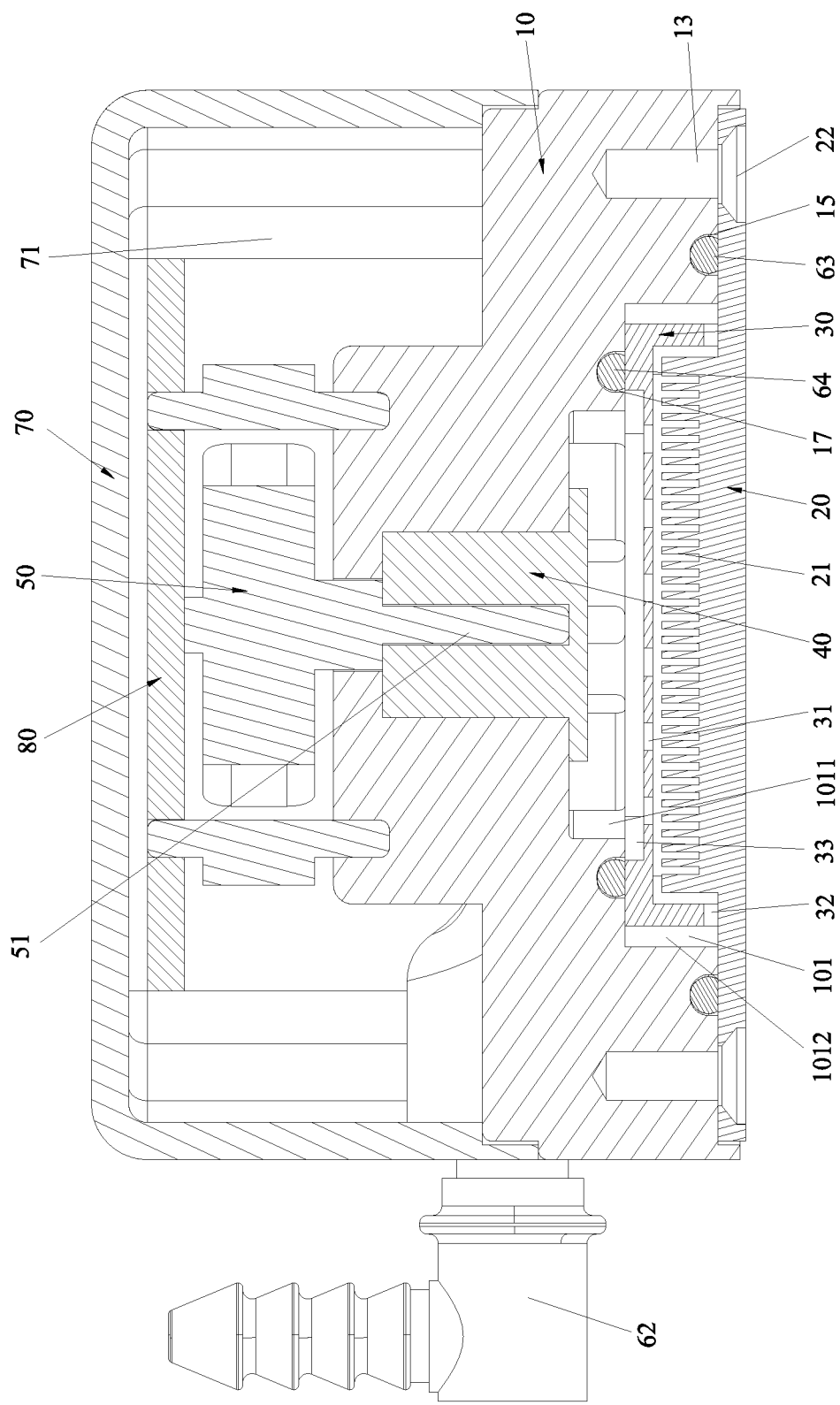
FIG. 6 is a cross-sectional view according to the preferred embodiment of the present invention.
Figure 7:
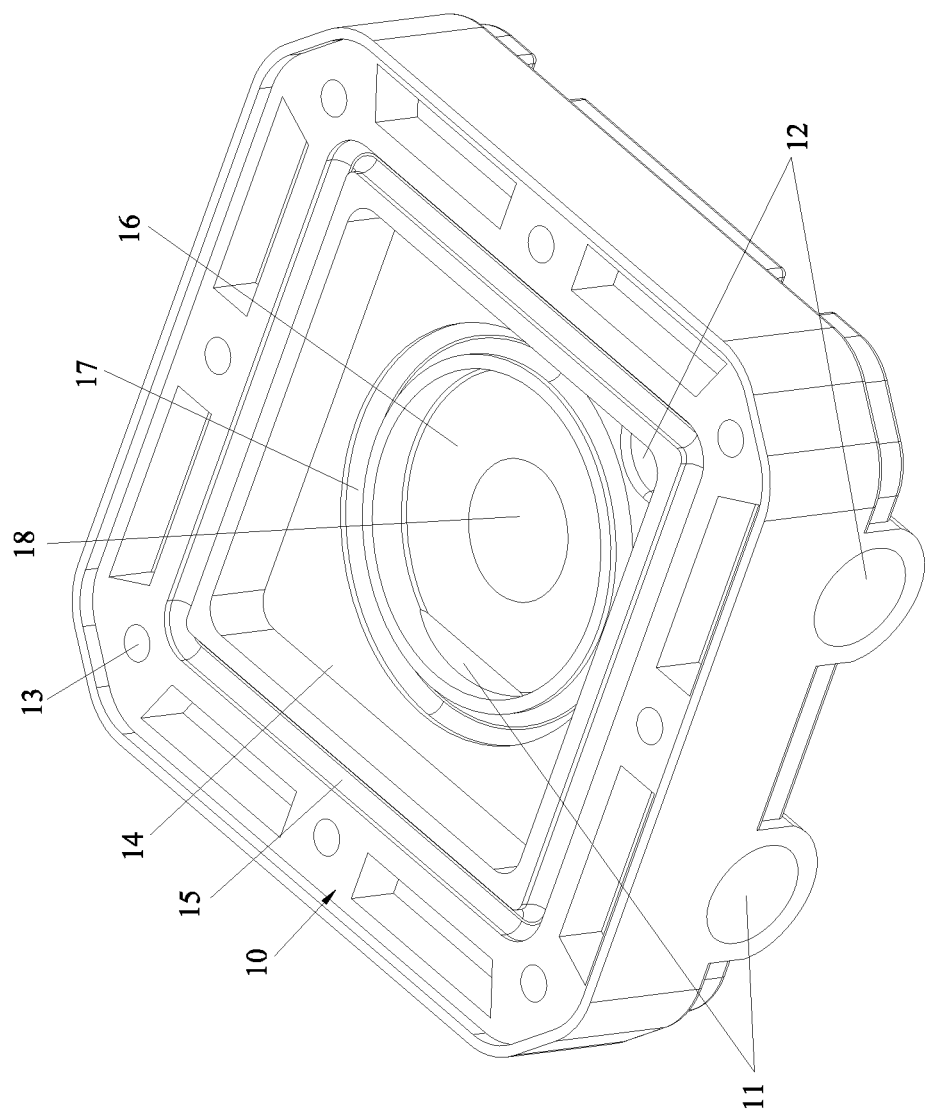
FIG. 7 is an enlarged view of the lower casing according to the preferred embodiment of the present invention.
Figure 8:
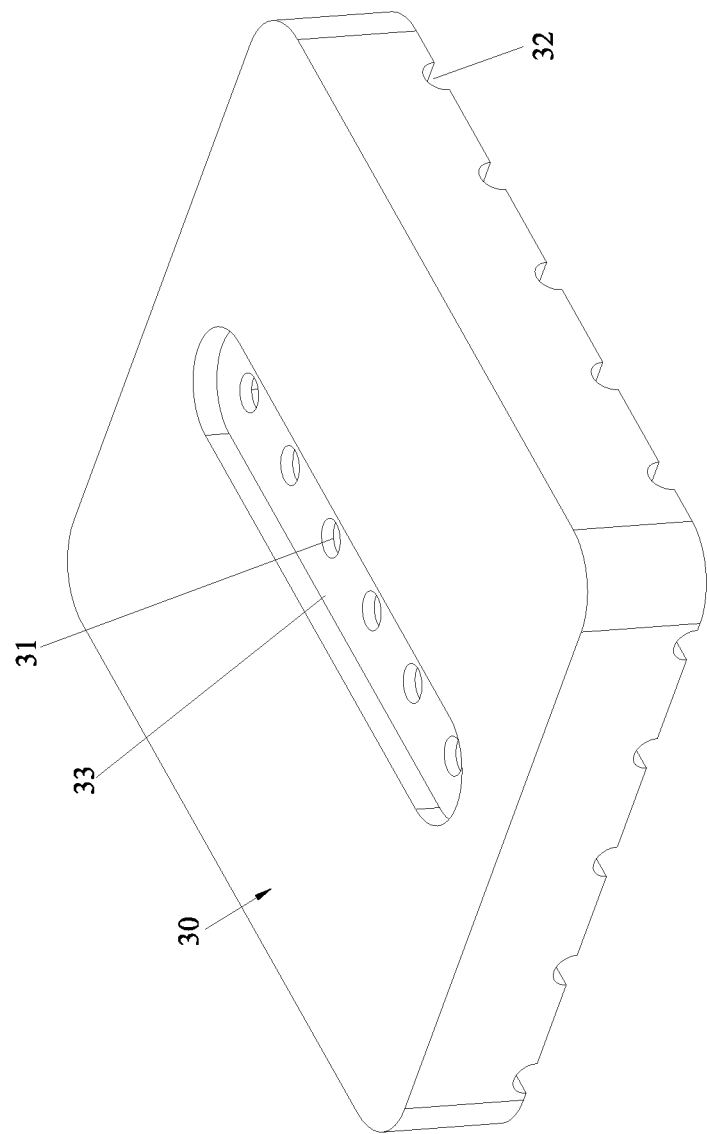
FIG. 8 is an enlarged view of the inner cover according to the preferred embodiment of the present invention.
Figure 9:
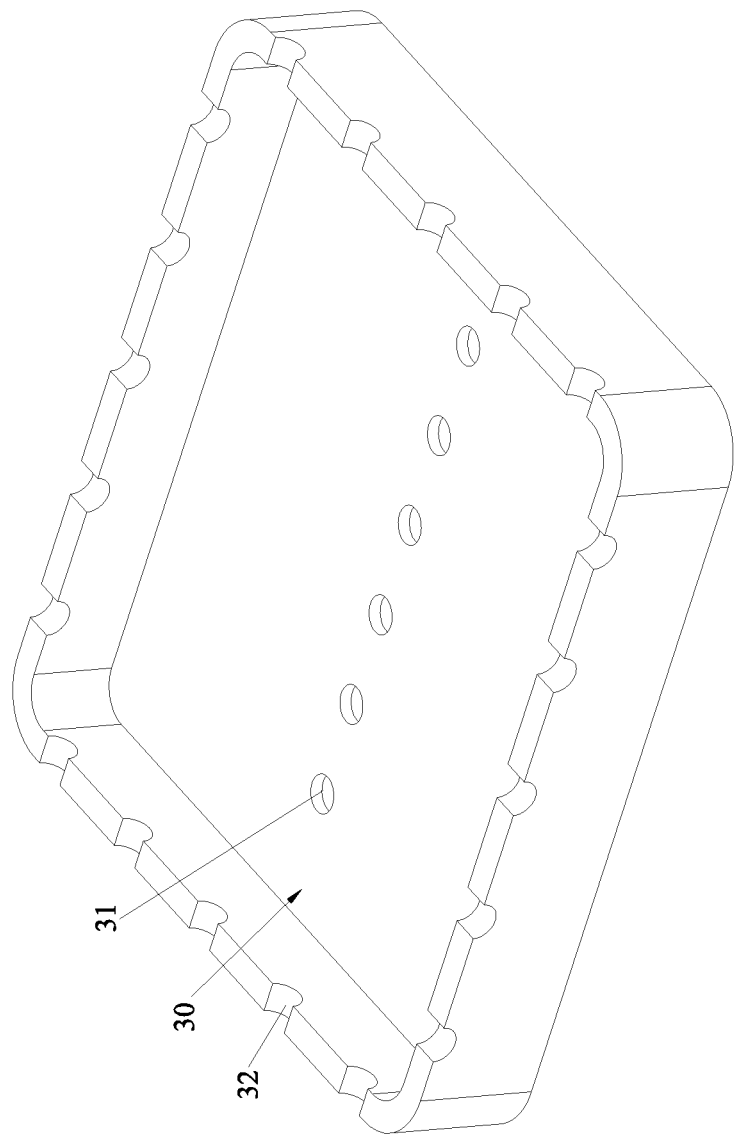
FIG. 9 is another enlarged view of the inner cover according to the preferred embodiment of the present invention.

Please refer to FIG. 1 through FIG. 9, which shows a specific structure according to a preferred embodiment of the present invention, comprising a heat sink base 20, an inner cover 30, an impeller 40, a lower casing 10 and a motor 50 that are arranged from bottom to top.

The lower casing 10 has a liquid inlet 11 and a liquid outlet 12. In this embodiment, the liquid inlet 61 and the liquid outlet 12 are provided with a liquid inlet coupler 61 and a liquid outlet coupler 62, respectively.

The heat sink base 20 is sealedly fixed to the bottom of the lower casing 10. An airtight accommodating chamber 101 is defined between the heat sink base 20 and the lower casing 10. The heat sink base 20 has a fin portion 21 extending from the surface of the heat sink base 20. In this embodiment, the heat sink base 20 has a square shape. The heat sink base 20 is made of copper or aluminum. The heat sink base 20 made of copper has a better heat dissipation effect. The bottom surface of the heat sink base 20 is flat. The heat sink base 20 is fixed to the bottom of the lower casing 10 through a plurality of screws (not shown). A plurality of fixing holes 22 are defined in the periphery of the heat sink base 20. A plurality of screw holes 13 are defined in the periphery of the bottom of the lower casing 10. The plurality of screws pass through the corresponding fixing holes 22 and the corresponding screw holes 13 to be screwed and fixedly connected.

The inner cover 30 is disposed on the heat sink base 20 and covers the fin portion 21. The inner cover 30 is located in the accommodating chamber 101 and partitions the accommodating chamber 101 into a liquid inlet chamber 1011 and a liquid outlet chamber 1012 which are sealed. The liquid inlet 11 and the liquid outlet 12 communicate with the liquid inlet chamber 1011 and the liquid outlet chamber 1012, respectively. The surface of the inner cover 30 is formed with first perforations 31 communicating with the liquid inlet chamber 1011 and the interior of the inner cover 30. The bottom of the circumferential side of the inner cover 30 is provided with second perforations 32 communicating with the liquid outlet chamber 1012 and the interior of the inner cover 30. In this embodiment, the inner cover 30 is made of a metal material and has a square shape. The center of the surface of the inner cover 30 is concavely provided with a groove 33. The bottom surface of the groove 33 is formed with the first perforations 31 that are spaced apart from each other. The first perforations 31 have different diameters. The diameter of the first perforation 3 away from the liquid inlet 11 is greater than the diameter of the first perforation 31 close to the liquid inlet 11, so that the coolant enters the inner cover 30 to be more evenly distributed on the fin portion 21. The coolant is more effectively utilized to enhance the heat dissipation effect. In addition, the bottom end surface of the inner cover 30 is recessed to form the plurality of second perorations 32. The plurality of second perforations 32 are evenly spaced and arranged around the circumferential side of the inner cover 30.

The impeller 40 is rotatably disposed in the liquid inlet chamber 1011. The motor 50 is disposed on the lower casing 10. An output shaft 51 of the motor 50 extends into the liquid inlet chamber 1011 and is coupled to the impeller 40. The motor 50 drives the impeller 40 to rotate.

A first sealing ring 63 is interposed between the periphery of the surface of the heat sink base 20 and the lower casing 10. A second sealing ring 64 is interposed between the periphery of the surface of the inner cover 30 and the lower casing 10. Specifically, the bottom of the lower casing 10 is recessed with a first recess 14 and a first annular positioning groove 15. The first annular positioning groove 15 is located at the periphery of the first recess 14. The first sealing ring 63 is embedded in the first annular positioning groove 15. The bottom surface of the first recess 14 is recessed with a second recess 16 and a second annular positioning groove 17. The second annular positioning groove 17 is located at the periphery of the second recess 16. The second sealing ring 64 is embedded in the second annular positioning groove 17. The liquid inlet 11 communicates with the inner side wall of the second recess 16. The liquid outlet 12 communicates with the inner side wall of the first recess 14. Moreover, the bottom surface of the second recess 16 is recessed with a positioning hole 18. The upper end of the impeller 40 is embedded in the positioning hole 18. Furthermore, the first sealing ring 63 is square, and the second seal ring 64 is circular.

In addition, the lower casing 10 is provided with an upper casing 70. A receiving chamber 71 is defined between the upper casing 70 and the lower casing 10. The motor 50 is located in the receiving chamber 71. Further, the receiving chamber 71 is provided with a circuit board 80. The circuit board 80 is disposed on the motor 50 and is electrically connected to the motor 50.

The working principle of this embodiment is as follows:
When in use, first, the heat sink base 20 is fixedly attached to a heat generating component, and the liquid inlet coupler 61 is connected to the cold liquid outlet of a cooling device. The liquid outlet coupler 62 is connected to the hot liquid inlet of the cooling device. The circuit board 80 is connected to an external power source. During operation, the heat generated by the heat generating component is transmitted to the fin portion 21 of the heat sink base 20. At this time, the circuit board 80 is powered on, so that the motor 50 is started to drive the impeller 40 to rotate at a high speed. The cold liquid outputted from the cooling device flows to the liquid inlet chamber 1011 from the liquid inlet 11 and enters the inside of the inner cover 30 from the first perforations 31 at a certain pressure. Then, the cold liquid is distributed on the fin portion 21 to absorb the heat of the fin portion 21. The cold liquid after the heat is absorbed becomes the hot liquid. The hot liquid flows from the respective second perforations 32 to the liquid outlet chamber 1012. Then, the hot liquid is discharged from the liquid outlet coupler 62 to enter the cooling device to be cooled for recycling.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. A water-cooled heat dissipation device, comprising a heat sink base, an inner cover, an impeller, a lower casing and a motor that are arranged from bottom to top; the lower casing having a liquid inlet and a liquid outlet; the heat sink base being sealedly fixed to a bottom of the lower casing, an airtight accommodating chamber being defined between the heat sink base and the lower casing, a first sealing ring being interposed between a periphery of a surface of the heat sink base and the lower casing, the heat sink base having a fin portion extending from the surface of the heat sink base; the inner cover being disposed on the heat sink base and covering the fin portion, the inner cover being located in the accommodating chamber and partitioning the accommodating chamber into a liquid inlet chamber and a liquid outlet chamber which are sealed, the liquid inlet and the liquid outlet communicating with the liquid inlet chamber and the liquid outlet chamber respectively, a surface of the inner cover being formed with first perforations communicating with the liquid inlet chamber and an interior of the inner cover, a bottom of a circumferential side of the inner cover being provided with second perforations communicating with the liquid outlet chamber and the interior of the inner cover, a second sealing ring being interposed between a periphery of the surface of the inner cover and the lower casing; the impeller being rotatably disposed in the liquid inlet chamber; the motor being disposed on the lower casing, an output shaft of the motor extending into the liquid inlet chamber and being coupled to the impeller;

wherein the bottom of the lower casing is recessed with a first recess and a first annular positioning groove, the first annular positioning groove is located at a periphery of the first recess, the first sealing ring is embedded in the first annular positioning groove, a bottom surface of the first recess is recessed with a second recess and a second annular positioning groove, the second annular positioning groove is located at a periphery of the second recess, the second sealing ring is embedded in the second annular positioning groove, the liquid inlet communicates with an inner side wall of the second recess, and the liquid outlet communicates with an inner side wall of the first recess.

2. The water-cooled heat dissipation device as claimed in claim 1, wherein a bottom surface of the second recess is recessed with a positioning hole, and an upper end of the impeller is embedded in the positioning hole.

3. The water-cooled heat dissipation device as claimed in claim 1, wherein the heat sink base is fixed to the bottom of the lower casing through a plurality of screws, a plurality of fixing holes are defined in a periphery of the heat sink base, a plurality of screw holes are defined in a periphery of the bottom of the lower casing, and the plurality of screws pass through the corresponding fixing holes and the corresponding screw holes to be screwed and connected.

4. The water-cooled heat dissipation device as claimed in claim 1, wherein a bottom end surface of the inner cover is recessed to form the plurality of second perorations, and the plurality of second perforations are evenly spaced and arranged around the circumferential side of the inner cover.

5. The water-cooled heat dissipation device as claimed in claim 1, wherein the lower casing is provided with an upper casing, a receiving chamber is defined between the upper casing and the lower casing, and the motor is located in the receiving chamber.

6. The water-cooled heat dissipation device as claimed in claim 5, wherein the receiving chamber is provided with a circuit board, and the circuit board is disposed on the motor and is electrically connected to the motor.

7. The water-cooled heat dissipation device as claimed in claim 1, wherein the first sealing ring is square, and the second seal ring is circular.

8. A water-cooled heat dissipation device, comprising a heat sink base, an inner cover, an impeller, a lower casing and a motor that are arranged from bottom to top; the lower casing having a liquid inlet and a liquid outlet; the heat sink base being sealedly fixed to a bottom of the lower casing, an airtight accommodating chamber being defined between the heat sink base and the lower casing, a first sealing ring being interposed between a periphery of a surface of the heat sink base and the lower casing, the heat sink base having a fin portion extending from the surface of the heat sink base; the inner cover being disposed on the heat sink base and covering the fin portion, the inner cover being located in the accommodating chamber and partitioning the accommodating chamber into a liquid inlet chamber and a liquid outlet chamber which are sealed, the liquid inlet and the liquid outlet communicating with the liquid inlet chamber and the liquid outlet chamber respectively, a surface of the inner cover being formed with first perforations communicating with the liquid inlet chamber and an interior of the inner cover, a bottom of a circumferential side of the inner cover being provided with second perforations communicating with the liquid outlet chamber and the interior of the inner cover, a second sealing ring being interposed between a periphery of the surface of the inner cover and the lower casing; the impeller being rotatably disposed in the liquid inlet chamber; the motor being disposed on the lower casing, an output shaft of the motor extending into the liquid inlet chamber and being coupled to the impeller; wherein a central portion of the surface of the inner cover is recessed with a groove, and a bottom surface of the groove is formed with the first perforations that are spaced apart from each other.

9. The water-cooled heat dissipation device as claimed in claim 8, wherein the heat sink base is fixed to the bottom of the lower casing through a plurality of screws, a plurality of fixing holes are defined in a periphery of the heat sink base, a plurality of screw holes are defined in a periphery of the bottom of the lower casing, and the plurality of screws pass through the corresponding fixing holes and the corresponding screw holes to be screwed and connected.

10. The water-cooled heat dissipation device as claimed in claim 8, wherein the first perforations have different diameters, and the diameter of the first perforation away from the liquid inlet is greater than the diameter of the first perforation close to the liquid inlet.

11. The water-cooled heat dissipation device as claimed in claim 8, wherein a bottom end surface of the inner cover is recessed to form the plurality of second perorations, and the plurality of second perforations are evenly spaced and arranged around the circumferential side of the inner cover.

12. The water-cooled heat dissipation device as claimed in claim 8, wherein the lower casing is provided with an upper casing, a receiving chamber is defined between the upper casing and the lower casing, and the motor is located in the receiving chamber.

13. The water-cooled heat dissipation device as claimed in claim 12, wherein the receiving chamber is provided with a circuit board, and the circuit board is disposed on the motor and is electrically connected to the motor.

14. The water-cooled heat dissipation device as claimed in claim 8, wherein the first sealing ring is square, and the second seal ring is circular.

* * * * *